United States Patent [19]
Gitlin et al.

[11] Patent Number: 5,880,620
[45] Date of Patent: Mar. 9, 1999

[54] PASS GATE CIRCUIT WITH BODY BIAS CONTROL

[75] Inventors: Daniel Gitlin, Sunnyvale; Sheau-Suey Li, Cupertino; Martin L. Voogel, Santa Clara; Tiemin Zhao, Palo Alto, all of Calif.

[73] Assignee: Xilinx, Inc., San Jose, Calif.

[21] Appl. No.: 840,582

[22] Filed: Apr. 22, 1997

[51] Int. Cl.⁶ ........................................... H03K 3/01

[52] U.S. Cl. .................... 327/534; 327/388; 327/434; 327/535

[58] Field of Search ............... 326/98; 327/388, 327/434, 534–535

[56] References Cited

U.S. PATENT DOCUMENTS 5,767,733  6/1998  Grugett ........................... 327/534

*Primary Examiner*—Margaret R. Wambach
*Attorney, Agent, or Firm*—Patrick T. Bever; Jeanette S. Harms

[57] ABSTRACT

A pass gate circuit includes a pass transistor and a body bias control circuit for biasing the body of the pass transistor to reduce body effect. The body bias control circuit includes one or more control transistors arranged to selectively connect the substrate (body) of the pass transistor to the drain or gate of the pass transistor when predetermined voltages are applied to the drain and gate of the pass transistor. As a result, the pass transistor exhibits a reduced body effect in the on-state. In one embodiment, the body bias control circuit includes a first control transistor having a drain and gate connected to the gate of the pass transistor, a gate connected to the drain of the pass transistor, and a source. The body bias control circuit also includes a second control transistor having a drain connected to the source of the first control transistor, a source connected to a body of the pass transistor, and a gate connected to the drain of the pass transistor. The bodies of the pass transistor, first control transistor and second control transistor are electrically interconnected. With this arrangement, the body of the pass transistor is biased "high" by the gate of the pass transistor only when both the gate and drain of the pass transistor are at a high voltage level.

22 Claims, 6 Drawing Sheets

PASS GATE CIRCUIT WITH BODY BIAS CONTROL

FIELD OF THE INVENTION

The present invention generally relates to integrated circuit devices, and in particular to pass transistors used to selectively control signal transmission between nodes of integrated circuit devices.

BACKGROUND OF THE INVENTION

Pass transistors are extensively used in programmable integrated circuit (IC) devices to selectively control signal transmission between two nodes. One type of programmable IC device utilizing pass gate transistors in this manner is field programmable gate arrays (FPGAs) manufactured by Xilinx, Inc. of San Jose, Calif.

FIG. 1 shows a simplified diagram of a conventional NMOS pass transistor 100 typically utilized in an FPGA manufactured by Xilinx, Inc. Pass transistor 100 includes a drain D connected to the output terminal of a first inverter 110, a source S connected to the input of a second inverter 120, a gate G connected to an SRAM cell 130, and a body B which is grounded. First and second inverters 110 and 120 serve as buffers for transmitting reliable signals along the path through pass transistor 100. SRAM cell 130 is depicted in a simplified form as a pair of inverters 132 and 134 connected in a loop. The programmed state of SRAM cell 130 determines the conductive state of pass transistor 100.

In operation, if a user's circuit requires the transmission of signals along the path through pass transistor 100, then SRAM cell 130 is programmed to apply a high signal to gate G, thereby turning on pass transistor 100. Subsequent signals transmitted from first inverter 110 are passed through pass transistor 100 to second inverter 120 and to subsequent circuitry on the FPGA.

A problem associated with pass transistor 100 is that the source-body bias often causes the "body effect" to increase the threshold voltage and thereby reduce the switching speed and transmission speed of pass transistor 100. This problem is described with reference to FIG. 1B, which compares drain-to-source current $I_{DS}$ versus gate-to-source voltage $V_{GS}$. As indicated in the solid line on FIG. 1B, when the body-to-source voltage $V_{BS}$ equals zero, the threshold voltage $V_{T1}$, of pass transistor 100 is relatively low (e.g., 0.5 volts), and the source voltage $V_S$ applied to the input of inverter 120 is the drain voltage $V_D$ minus $V_{T1}$. However, when a (logic) high voltage is transmitted across pass transistor 100, source S achieves a higher voltage level than body B (which is grounded), thereby producing a negative $V_{BS}$ (e.g., −1 volts). When this occurs, the resulting "body effect" causes the threshold voltage to shift to the right, as indicated by the dashed line in FIG. 1B, resulting in a relatively high threshold voltage $V_{T2}$. The higher $V_{T2}$ causes pass transistor 100 to turn on at a slower rate because more time is required for gate G to reach $V_{T2}$ (as compared to the time necessary to reach $V_{T1}$). In addition, the higher $V_{T2}$ causes a higher $V_{DS}$ and a lower $V_S$. This becomes particularly important at low operating voltage levels because $V_T$ is essentially fixed.

The above-described "body effect" can be reduced using various methods such as lowering substrate doping, or lowering the source-body bias by connecting the substrate (body) to a voltage source (such as $V_G$). However, lowering the substrate doping leads to higher off-state leakage currents and more severe short channel effects. Further, lowering the substrate doping typically requires fundamental changes to the device technology utilized to produce the IC device incorporating the pass transistors. Further, lowering the source-body bias requires a positive substrate voltage which may forward bias several PN junctions and cause high leakage and latch-up.

SUMMARY OF THE INVENTION

In accordance with the present invention, a pass gate circuit includes a pass transistor and a body bias control circuit having one or more control transistors arranged to selectively (dynamically) connect the body of the pass transistor to at least one of the drain and the gate of the pass transistor only when predetermined voltages are applied to at least one of the drain and gate of the pass transistor. As a result, the pass transistor exhibits a reduced body effect in the on-state. By generating a normal threshold voltage in the off-state, a reliably low leakage current is produced. By reducing the threshold voltage in the on-state, the drive current is increased when both the gate and drain of the transistor are at high voltage ($V_{dd}$). The body effect may be further decreased by electrically interconnecting the bodies of at least one of the control transistors to the body of the pass transistor. This interconnection may be accomplished, for example, by forming the control transistor and pass transistor in a common p-well such that these transistors are isolated from other devices by a N-substrate, a silicon-on-insulator (SOI) wafer, or a P-substrate wafer using triple-well technology.

In accordance with a first embodiment of the present invention, the body bias control circuit includes a first control transistor and a second control transistor connected in series. The first control transistor includes a drain and a gate, both connected to the gate of the pass transistor, and a source. The second bias control transistor includes a drain connected to the source of the first control transistor, a gate connected to the drain of the pass transistor, and a source connected to the body of the pass transistor. The body of the pass transistor is selectively connected to the gate of the pass transistor through the first and second control transistors only when both the gate and drain of the pass transistor are at a high voltage level.

In accordance with an aspect of the first embodiment, the bodies of each of the first and second control transistors are electrically connected to the body of the pass transistor by forming all three transistors in, for example, a common P-well which is isolated from other devices.

In accordance with a second embodiment of the present invention, the body bias control circuit includes a single control transistor having a drain connected to the gate of the pass transistor, a source connected to the body of the pass transistor, and a gate connected to the drain of the pass transistor. The body of the pass transistor is selectively connected to the gate of the pass transistor through the control transistor when the drain of the pass transistor is at a high voltage level.

In accordance with a third embodiment of the present invention, the body bias control circuit includes a single control transistor having a drain connected to the drain of the pass transistor, a source connected to the body of the pass transistor, and a gate connected to the gate of the pass transistor. In the third embodiment, the body of the pass transistor is selectively connected to the drain of the pass transistor through the control transistor when the gate is at a high voltage level.

In accordance with a fourth embodiment of the present invention, the body bias control circuit includes a first control transistor and a second control transistor. The first control transistor includes a drain connected to the drain of the pass transistor, a source connected to the body of the pass transistor, and a gate connected to the gate of the pass transistor. The second control transistor includes a drain connected to the gate of the pass transistor, a gate connected to the drain of the pass transistor, and a source connected to the body of the pass transistor. The body of the pass transistor is selectively connected to the drain and the gate of the pass transistor through the first and second control transistors, respectively, when both the gate and drain of the pass transistor are at a high voltage levels. Alternatively, when the drain switches low, the first control transistor remains turned on so that the body discharges through the first control transistor.

In accordance with a fifth embodiment of the present invention, the body bias control circuit includes a first control transistor and a second control transistor. The first control transistor includes a drain connected to the gate of the pass transistor, a source connected to the body of the pass transistor, and a gate connected to the drain of the pass transistor. The second control transistor includes a drain connected to the gate of the pass transistor, a gate connected to the source of the pass transistor, and a source connected to the body of the pass transistor.

In accordance with a sixth embodiment of the present invention, the body bias control circuit includes a first control transistor, a second control transistor and third control transistor. The first control transistor includes a drain connected to the gate of the pass transistor, a source connected to the body of the pass transistor, and a gate connected to the drain of the pass transistor. The second control transistor includes a drain connected to the gate of the pass transistor, a gate connected to a source of the pass transistor, and a source connected to the body of the pass transistor. The third control transistor includes a drain connected to the drain of the pass transistor, a source connected to the body of the pass transistor, and a gate connected to the gate of the pass transistor.

In accordance with a seventh embodiment of the present invention, the body bias control circuit includes a first control transistor and a second control transistor. The first control transistor includes a drain connected to the gate of the pass transistor, a gate connected to the drain of the pass transistor, and a source connected to the body of the pass transistor. The second control transistor includes a drain connected to the source of the first control transistor and to the body of the pass transistor, a gate, and a source connected to ground. The gate of the second control transistor is controlled by a first signal, and the drain of the pass transistor is controlled by a second signal which is the logical inverse of the first signal. When the first signal is low and the second signal is high, the body of the pass transistor is connected to the gate of the pass transistor through the first control transistor. When the first signal is high and the second signal is low, the body of the pass transistor discharges through the second control transistor to ground.

In accordance with an aspect of the seventh embodiment, the pass gate circuit further includes an inverter having an input connected to the gate of the second control transistor, and an output connected to the drain of the pass transistor.

In accordance with an eighth embodiment of the present invention, the body bias control circuit includes a first control transistor and a second control transistor. The first control transistor includes a drain connected to the drain of the pass transistor, a gate connected to the gate of the pass transistor, and a source connected to the body of the pass transistor. The second control transistor includes a drain connected to the source of the first control transistor, a gate, and a source connected to ground. The gate of the second control transistor is controlled by a first signal, and the drain of the pass transistor is controlled by a second signal which is the logical inverse of the first signal. When the first signal is low and the second signal is high, the body of the pass transistor is connected to the second signal through the first control transistor. When the gate is high and the first signal is high (the second signal is low), the body of the pass transistor discharges through the second control transistor to ground.

In accordance with an aspect of the eighth embodiment, the pass gate circuit further includes an inverter having an input connected to the gate of the second control transistor, and an output connected to the drain of the pass transistor.

In accordance with a ninth embodiment of the present invention, the body bias control circuit includes a first control transistor and a second control transistor. The first control transistor includes a drain connected to the drain of the pass transistor, a gate connected to the gate of the pass transistor, and a source connected to the body of the pass transistor. The second control transistor includes a drain connected to ground, a gate connected to the gate of the pass transistor, and a source connected to the body of the pass transistor. The first control transistor is an NMOS transistor, and the second control transistor is a PMOS transistor. When the gate of the pass transistor is high, the first control transistor is turned on and the second control transistor is turned off, thereby controlling the body bias using the drain voltage. Conversely, when the gate is low, the second control transistor is turned on, thereby connecting the body of the pass transistor to ground.

In accordance with a tenth embodiment of the present invention, the body bias control circuit includes a first control transistor and a second control transistor. The first control transistor includes a drain connected to the gate of the pass transistor, a gate connected to the drain of the pass transistor, and a source connected to the body of the pass transistor. The second control transistor includes a drain connected to ground, a gate connected to the gate of the pass transistor, and a source connected to the body of the pass transistor. As in the eighth embodiment, the first control transistor is an NMOS transistor, and the second control transistor is a PMOS transistor. Therefore, when the gate is low, the second control transistor is turned on, thereby connecting the body of the pass transistor to ground.

In accordance with an eleventh embodiment of the present invention, the body bias control circuit includes a first control transistor and a second control transistor. The first control transistor includes a drain connected to the drain of the pass transistor, a gate connected to the gate of the pass transistor, and a source connected to the body of the pass transistor. The second control transistor includes a source connected to ground, a gate, and a drain connected to the body of the pass transistor. The gate of the second control transistor is controlled by a first signal, and the gate of the pass transistor is controlled by a second signal which is the logical inverse of the first signal.

In accordance with an aspect of the eleventh embodiment, the pass gate circuit further includes an inverter having an input connected to the gate of the second control transistor, and an output connected to the gate of the pass transistor. The inverter is preferably incorporated into an SRAM cell utilized on a programmable IC device to program the pass gate circuit.

In accordance with an twelfth embodiment of the present invention, the body bias control circuit includes a first control transistor and a second control transistor. The first control transistor includes a first control transistor having a drain and connected to the gate of the pass transistor, a gate connected to the drain of the pass transistor, and a source connected to the body of the pass transistor. The second control transistor includes a source connected to ground, a gate, and a drain connected to the body of the pass transistor. As in the eleventh embodiment, the gate of the second control transistor is controlled by a first signal generated, for example, from the input of an inverter, and the gate of the pass transistor is controlled by a signal generated from the output of an inverter.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 2:
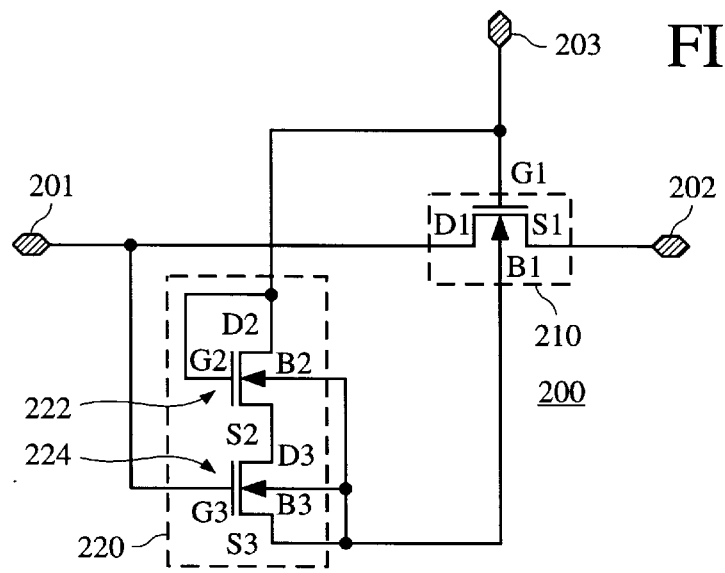
FIG. 2 is a simplified circuit diagram showing an pass gate circuit in accordance with a first embodiment of the present invention.

FIG. 2 shows a simplified circuit diagram illustrating a pass gate circuit 200 in accordance with a first embodiment of the present invention. Pass gate circuit 200 is connected between a first (signal source) node 201 and a second (signal destination) node 202. A pass gate control signal is provided from a third (gate control source) node 203. As discussed above with respect to the conventional pass transistor 100, first node 201 can be, for example, the output of an inverter or other buffer circuit, and second node 202 can be the input of an inverter or other buffer circuit. Similarly, third node 203 can be, for example, the signal provided by an SRAM cell or other memory circuit.

Pass gate circuit 200 includes an NMOS pass transistor 210 and a body bias control circuit 220. Pass transistor 210 includes a drain (first terminal) D1 connected to the first node 201, a source (second terminal) S1 connected to the second node 202, a gate G1 connected to the third node 203, and a body B1. Body bias control circuit 220 includes a first pass (control) transistor 222 and a second pass (control) transistor 224 which are connected in series between third node 203 and body B1 of pass transistor 210. First control transistor 222 includes a drain (first terminal) D2 connected to gate G1 (third node 203), a source (second terminal) S2, a gate G2 also connected to gate G1, and a body B2. Second control transistor 224 includes a drain (first terminal) D3 connected to source S2 of first control transistor 222, a source (second terminal) S3 connected to body B1 of pass transistor 210, a gate G3 connected to node 201 (drain D1), and a body B3.

As indicated in FIG. 2, bodies B1, B2 and B3 are electrically interconnected. This interconnection is achieved, for example, by forming all three transistors 210, 222 and 224 in a common p-well such that these transistors are isolated from other devices by a N-substrate, a silicon-on-insulator (SOI) wafer, or a P-substrate wafer using triple-well technology. Further, the channel widths of control transistors 222 and 224 can be significantly narrower than that of pass transistor 210 (for example, pass transistor 210 can be ten times wider than each control transistor 222 and 224).

Figure 1A:
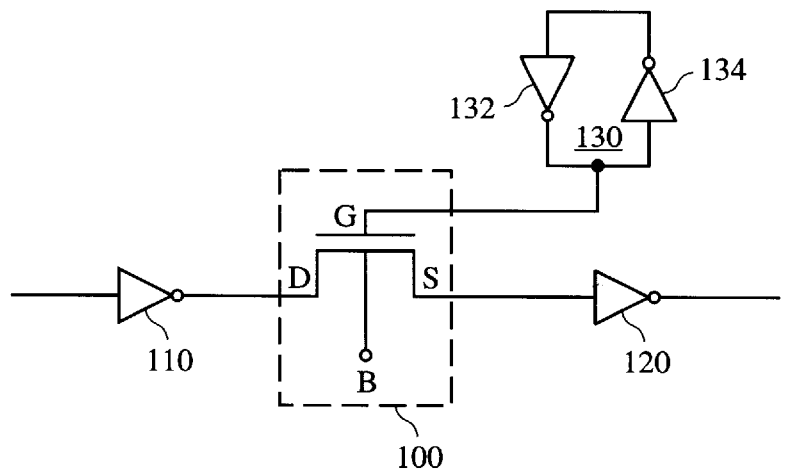
FIG. 1A is a simplified circuit diagram showing an example of a conventional pass transistor and associated control circuitry as utilized in a programmable IC device.
Figure 1B:
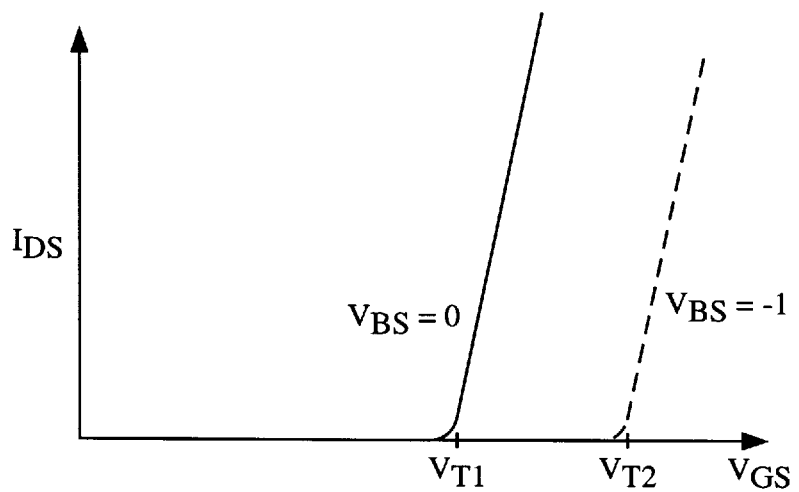
FIG. 1B is a diagram illustrating the effect of body effect on the threshold voltage of the pass transistor shown in FIG. 1A.

In operation, a high voltage signal applied from third node 203 to gate G1 turns on pass transistor 210 such that signals applied on first node 201 are passed to second node 202. In addition, the high signal is applied to drain D2 and gate G2 of control transistor 222, thereby turning on first control transistor 222. Subsequently, when signals passing along the path between first node 201 and second node 202 switch to a high voltage level, this high voltage level is applied to gate G3, thereby turning on second control transistor 224. With both first control transistor 222 and second control transistor 224 turned on, body B1 of pass transistor 210 is connected to the high voltage signal present on gate G1 of pass transistor 210. In effect, body bias control circuit 220 acts as an AND logic gate such that body B1 is selectively connected to gate G1 (i.e., high or $V_{dd}$) only when both drain D1 and gate G1 are at predetermined (in this case, high) voltage levels. As a result, the voltage level of body B1 is raised to substantially the high voltage level applied to gate G1 (minus a threshold voltage drop across the control transistors), thereby maintaining body B1 at substantially the same level as source S1 (i.e., $V_{BS}$ substantially equals zero, as shown in FIG. 1B).

Although pass gate circuit 200 provides a beneficial feature of introducing very little additional capacitance on the signal path between first node 201 and second node 202, this circuit may be disfavored in certain applications and using certain technologies. For example, although the use of two control transistors (222 and 224) clearly illustrates the AND logic used to control the body bias function (i.e., one controlled by each of gate G1 and drain D1), the area occupied by both control transistors may unacceptably increase the size of pass gate circuit 200. Further, if drain D1 switches from a high voltage level to a low voltage level while gate G1 remains at a high voltage level, then the only discharge path from body B1 (i.e., the p-well) may be through the source-junction—in some instances, the resulting injection may cause latch-up. In addition, body B1 floats when either gate G1 or drain D1 is at a low voltage level. If the body voltage $V_B$ of body B1 is greater than the drain voltage $V_D$ at drain D1 or the source voltage $V_S$ at source S1, then the threshold voltage $V_T$ of pass transistor 210 is lowered (this is known as the "reverse" body effect). When gate voltage $V_G$ is low, pass transistor 210 may leak when the drain voltage $V_D$ and source voltage $V_S$ have different potentials. Another potential problem occurs if gate G1 is driven by a very weak memory cell. In this case, when gate G1 is high and drain D1 switches from low to high, the resulting sudden connection of body B1 to gate G1 may disturb the memory cell (i.e., cause the memory cell to change states).

Some of the above-mentioned potential problems associated with pass gate circuit 200 are addressed in the embodiments disclosed in FIGS. 3 through 12.

Figure 3:
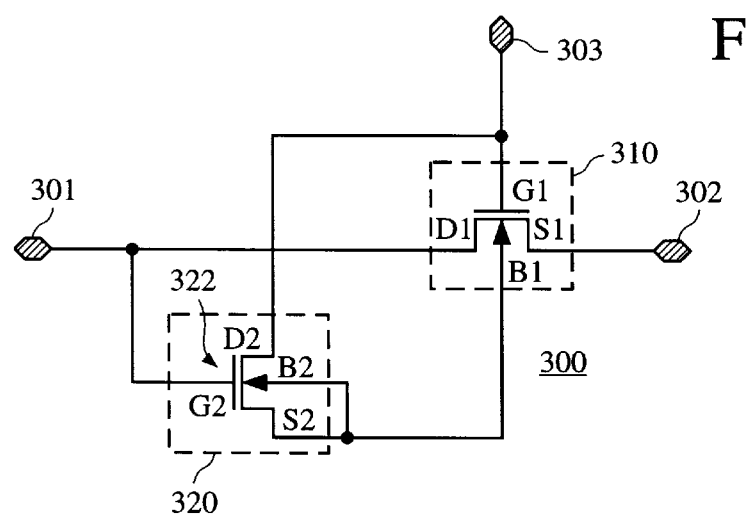
FIG. 3 is a simplified circuit diagram showing an pass gate circuit in accordance with a second embodiment of the present invention.

FIG. 3 shows a simplified circuit diagram illustrating a pass gate circuit 300 in accordance with a second embodiment of the present invention. Pass gate circuit 300 is connected between a first (signal source) node 301 and a second (signal destination node 302), and receives a control signal from a third (gate control source) node 303. Pass gate 300 includes an NMOS pass transistor 310 and a body bias control circuit 320. Pass transistor 310 includes a drain (first terminal) D1 connected to the first node 301, a source (second terminal) S1 connected to the second node 302, a gate G1 connected to the third node 303, and a body B1. Body bias control circuit 320 includes a pass (control) transistor 322 which is connected between third node 303 and body B1 of pass transistor 310. Control transistor 322 includes a drain (first terminal) D2 connected to gate G1 (third node 303), a source (second terminal) connected to body B1, a gate G2 connected to drain D1 (first node 301) and a body B2 electrically interconnected with body B1.

In operation, when a high voltage signal is applied from third node 303 to gate G1 of pass transistor 310, gate G1 is turned on such that signals applied on first node 301 are passed to second node 302. In addition, the high voltage signal is applied to drain D2 of control transistor 322. Subsequent high signals passing along the path between first node 301 and second node 302 are applied to gate G2, thereby turning on control transistor 322. With control transistor 322 turned on, body B1 of pass transistor 310 is connected to the high voltage signal present on gate G1 of pass transistor 310. Similar to the above-described bias control circuit 220 (see FIG. 2), body bias control circuit 320 acts as an AND logic gate such that body B1 is high only when both drain D1 and gate G1 are at a predetermined (in this case, high) voltage level. As a result, the voltage level of body B1 is raised to substantially the high voltage level applied to gate G1 (minus a voltage drop across control transistor 322), thereby maintaining body B1 at substantially the same level as source S1.

Because bias control circuit 320 utilizes only a single control transistor, pass gate circuit 300 provides an advantage over pass gate circuit 200 (described above) in that the layout area required for the pass gate circuit 300 is relatively smaller than for pass gate circuit 200. Further, similar to pass gate circuit 200, pass gate circuit 300 introduces very little additional capacitance on the signal path between first node 301 and second node 302. Moreover, when $V_G$ of pass transistor 310 is at a lower voltage level and $V_S$ is high, body B1 is grounded, thereby preventing the potential problems associated with pass gate circuit 200 when body B1 is floating under similar circumstances.

Although pass gate circuit 300 provides certain advantages over pass gate circuit 200, several of the problems associated with pass gate circuit 200 remain unaddressed. For example, pass gate circuit 300 fails to address the potential latch-up problem caused by discharge from body B1 through the source-junction when drain D1 switches from high to low while gate G1 remains high. In addition, body B1 floats when drain D1 is at a low voltage level, so the body voltage $V_B$ of body B1 may be greater than the source voltage $V_S$ at source S1, and the threshold voltage $V_T$ of pass transistor 310 may be lowered. Finally, the memory cell disturb problem mentioned above remains unaddressed.

Figure 4:
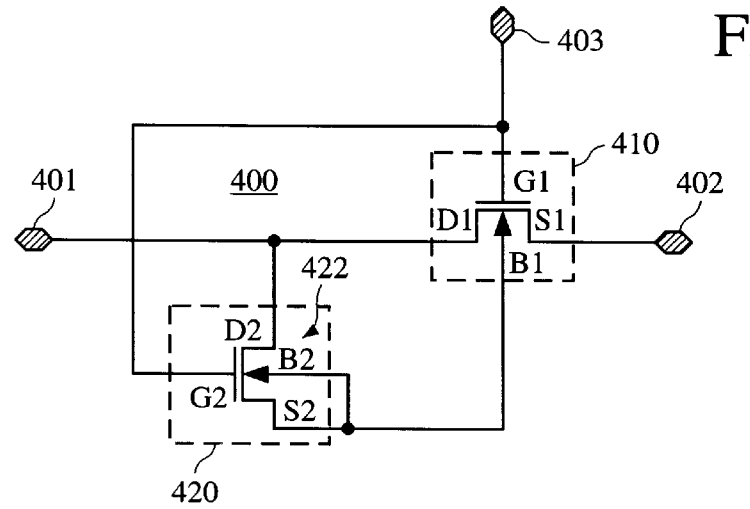
FIG. 4 is a simplified circuit diagram showing an pass gate circuit in accordance with a third embodiment of the present invention.

FIG. 4 shows a simplified circuit diagram illustrating a pass gate circuit 400 in accordance with a third embodiment of the present invention. Pass gate 400 includes a pass transistor 410 and a body bias control circuit 420. Pass transistor 410 includes a drain (first terminal) D1 connected to a first node 401, a source (second terminal) S1 connected to a second node 402, a gate G1 connected to a third node 403, and a body B1. Similar to pass gate circuit 300, bias control circuit 420 includes a single control transistor 422. However, instead of being connected between third node 403 and body B1 (as in bias control circuit 320, discussed above), control transistor 422 is connected between first node 401 and body B1. In particular, control transistor 422 includes a drain (first terminal) D2 connected to drain D1 (first node 401), a gate G2 which is connected to gate G1 (third node 403), a source (second terminal) connected to body B1, and a body B2 electrically interconnected with body B1.

In operation, when a high signal from third node 403 turns on gate G1, the high signal is also applied to gate G2, thereby also turning on control transistor 422. Subsequent signals passing along the path between first node 401 and second node 402 pass through control transistor 422 such that body B1 is biased to the voltage level at drain D1. Bias control circuit 420 selectively connects body B1 to drain D1 only when gate G1 is at a predetermined voltage level. As a result, the voltage level of body B1 is biased to the drain voltage $V_D$ at drain D1 at any particular moment (minus a voltage drop across control transistor 422), thereby maintaining body B1 at substantially the same level as source S1.

Similar to bias control circuit 320, bias control circuit 420 utilizes only a single control transistor. However, the drain-drain and gate-gate connections of pass gate circuit 400 require less layout area than the drain-gate and gate-drain connections in pass gate circuit 300. Therefore, pass gate circuit 400 can be utilized in a smaller layout area than pass gate circuit 300. Further, unlike bias control circuit 320, bias control circuit 420 provides a discharge path (through control transistor 422) for body B1 when drain D1 is at a low voltage level. Moreover, body B1 is not connected to gate G1 through control transistor 422 (when both drain D1 and gate G1 are high), thereby avoiding the memory-disturb problem mentioned above.

On the other hand, because the path through pass transistor 410 is connected to body B1, the capacitance of body B1 may reduce the signal propagation speed through pass transistor 410. Further, because body B1 floats when gate G1 is low, pass transistor 410 may leak when $V_S$ and $V_D$ are different potentials.

Figure 5:
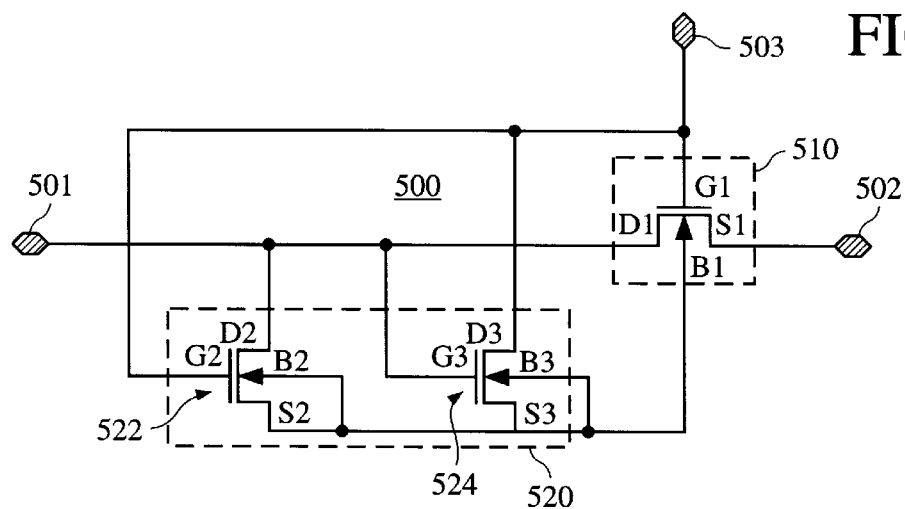
FIG. 5 is a simplified circuit diagram showing an pass gate circuit in accordance with a fourth embodiment of the present invention.

FIG. 5 shows a simplified circuit diagram illustrating a pass gate circuit 500 in accordance with a fourth embodiment of the present invention. Pass gate circuit 500 includes an NMOS pass transistor 510 and a body bias control circuit 520. Pass transistor 510 includes a drain (first terminal) D1 connected to a first node 501, a source (second terminal) S1 connected to a second node 502, a gate G1 connected to a third node 503, and a body B1. Bias control circuit 520 includes a first control transistor 522 and a second control transistor 524. First control transistor 522 includes a drain (first terminal) D2 connected to drain D1 (first node 501), a source (second terminal) S2 connected to body B1, a gate G2 connected to gate G1 (third node 503), and a body B2. Second control transistor 524 includes a drain (first terminal) D3 connected to gate G1 (third node 503), a source (second terminal) S3 connected to body B1 of pass transistor 510, a gate G3 connected to drain D1 (node 501), and a body B3. Bodies B1, B2 and B3 are electrically interconnected.

In operation, pass transistor 510 is turned on by a high signal applied from third node 503 to gate G1. In addition, the high signal turns on first control transistor 522 and is applied to drain D3 of second control transistor 524. Accordingly, body B1 is connected through first control transistor 522 to drain D1. When a high signal is supplied from first node 501, this high signal is passed through first control transistor 522 to body B1. In addition, this high signal turns on second control transistor 524, thereby applying the high signal at gate G1 to body B1 through second control circuit 524. As a result, the voltage level of body B1 is raised to substantially the high voltage level applied to gate G1 and drain D1 (minus a voltage drop across the control transistors), thereby maintaining body B1 at substantially the same level as source S1.

Conversely, when the signal from first node 501 switches low, second control transistor 524 turns off, but first control transistor 522 remains turned on. When the voltage level at drain D1 drops below the $V_B$ of body B1, body B1 discharges to first node S1 through first control transistor 522, thereby avoiding the potential latch-up problem discussed above. Further, body B1 only floats if both the $V_G$ and the $V_D$ of pass transistor 510 are low, thereby avoiding leakage problems when $V_S$ is high and $V_D$ is low. (However, leakage may occur if $V_S$ is low and $V_D$ is high.)

Potential speed problems may arise due to the connection of drain D1 to the body B1 through first control transistor 522. Namely, the capacitance of body B1 may slow signal propagation through pass transistor 510. Further, because gate G1 is connected to body B1 through second control transistor 524, the potential memory-disturb problem (discussed above) may arise.

Figure 6:
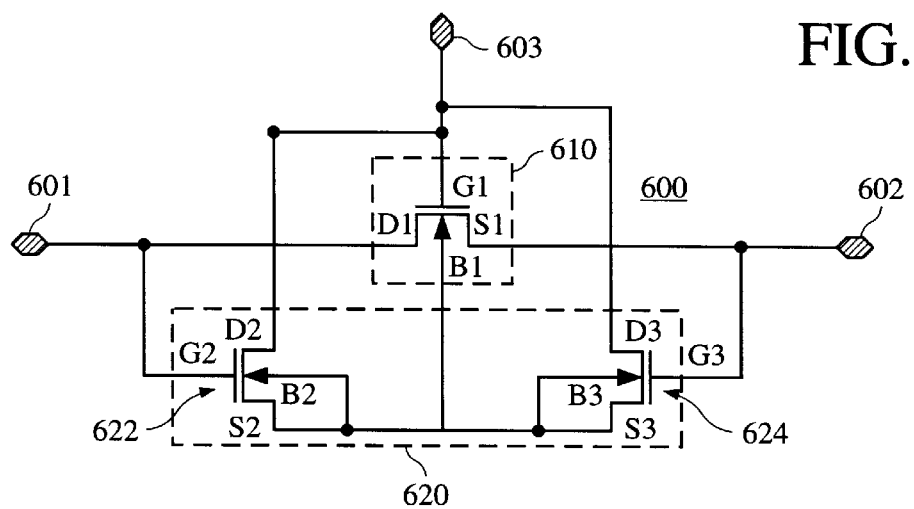
FIG. 6 is a simplified circuit diagram showing an pass gate circuit in accordance with a fifth embodiment of the present invention.

FIG. 6 shows a simplified circuit diagram illustrating a pass gate circuit 600 in accordance with a fifth embodiment of the present invention. Pass gate circuit 600 includes an NMOS pass transistor 610 and a body bias control circuit 620. Pass transistor 610 includes a drain (first terminal) D1 connected to a first node 601, a source (second terminal) S1 connected to a second node 602, a gate G1 connected to a third node 603, and a body B1. Bias control circuit 620 includes a first control transistor 622 and a second control transistor 624. First control transistor 622 includes a drain (first terminal) D2 connected to gate G1 (third node 603), a source (second terminal) S2 connected to body B1, a gate G2 connected to drain D1 (first node 601), and a body B2. Second control transistor 624 includes a drain (first terminal) D3 connected to gate G1 (third node 603), a source (second terminal) S3 connected to body B1 of pass transistor 610, a gate G3 connected to source S1 (second node 602), and a body B3. Bodies B1, B2 and B3 are electrically interconnected.

In operation, pass transistor 610 is turned on by a high signal applied from third node 603 to gate G1. In addition, the high signal is applied to drain D2 of first control transistor 622 and to drain D3 of second control transistor 624. When a high signal is supplied from first node 601, this high signal is passed through pass transistor 610 to source S1. In addition, the high signal turns on first control transistor 622, thereby transmitting the high voltage on gate G1 to body B1. In addition, the high signal transmitted through pass transistor 610 to source S1 turns on second control transistor 624, thereby also applying the high signal at gate G1 to body B1 through second control circuit 624. As a result, the voltage level of body B1 is raised to substantially the high voltage level present at gate G1 (minus a voltage drop across the control transistors), thereby maintaining body B1 at substantially the same level as source S1.

Conversely, when the signal from first node 601 switches low, first control transistor 622 and second control transistor 624 turn off. This prevents the above-mentioned leaky transistor problems because body B1 only floats when both the $V_D$ of drain D1 and the $V_S$ of source S1 are zero. However, bias control circuit 620 places two gates (G2 and G3) in the signal path through pass transistor 610, which may reduce signal propagation speed. Further, if the $V_S$ and/or $V_D$ switch low while the $V_G$ of gate G1 is high, the only discharge path is through the source- and drain-junctions which may cause latch-up. Further, the connection of body B1 to gate G1 through first and second control transistors 622 and 624 may disturb a memory cell (not shown) connected to third node 603.

Figure 7:
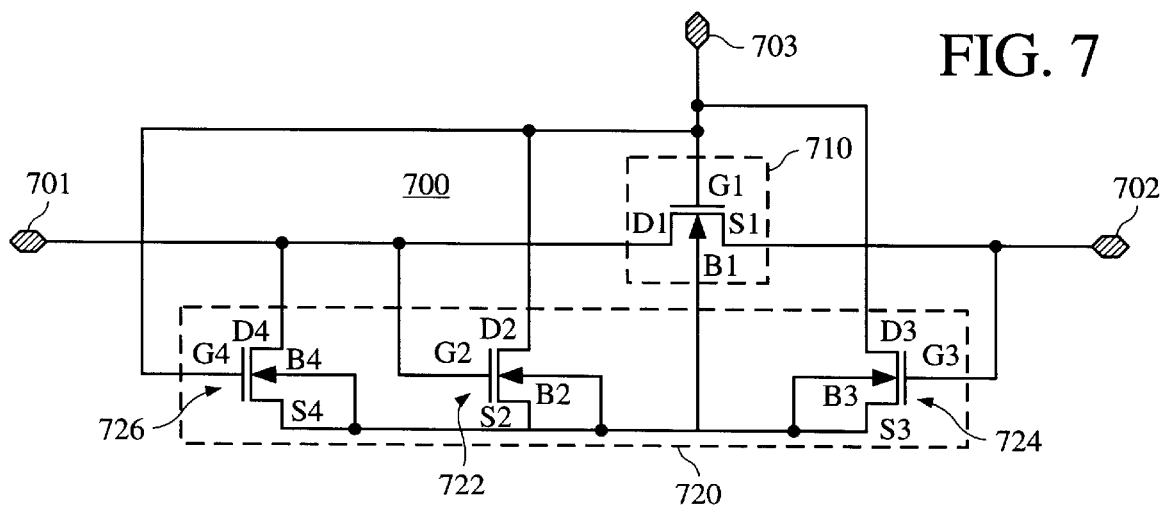
FIG. 7 is a simplified circuit diagram showing an pass gate circuit in accordance with a sixth embodiment of the present invention.

FIG. 7 shows a simplified circuit diagram illustrating a pass gate circuit 700 in accordance with a sixth embodiment of the present invention. Pass gate circuit 700 includes an NMOS pass transistor 710 and a body bias control circuit 720. Pass transistor 710 includes a drain (first terminal) D1 connected to a first node 701, a source (second terminal) S1 connected to a second node 702, a gate G1 connected to a third node 703, and a body B1. Bias control circuit 720 includes a first control transistor 722, a second control transistor 724 and a third control transistor 726. First control transistor 722 and second control transistor 724 are connected to pass transistor 710 in a manner consistent with control transistors 622 and 624 of pass gate circuit 600 (see FIG. 6). However, in addition to first control transistor 722 and second control transistor 724, pass gate circuit 700 includes third control transistor 726 which includes a drain (first terminal) D4 connected to drain D1 (first node 701), a source (second terminal) S4 connected to body B1, a gate G4 connected to gate G1 (third node 703), and a body B4. Bodies B1, B2, B3 and B4 are electrically interconnected.

In operation, pass transistor 710 is turned on by a high signal applied from third node 703 to gate G1. Similar to pass gate circuit 600, this high signal is applied to drain D2 of first control transistor 722 and to drain D3 of second control transistor 724. In addition, the high signal is applied to gate G4 of third control transistor 726. When a high signal is supplied from first node 701, this high signal is passed through pass transistor 710 to source S1. The high signal also turns on first control transistor 722, thereby transmitting the high voltage on gate G1 to body B1, and is transmitted through third control transistor 726 to body B1. In addition, the high signal transmitted through pass transistor 710 to source S1 turns on second control transistor 724, thereby also applying the high signal at gate G1 to body B1 through second control circuit 724. As a result, the voltage level of body B1 is raised to substantially the high voltage level present at drain D1 and gate G1 (minus a voltage drop across the control transistors), thereby maintaining body B1 at substantially the same level as source S1.

Conversely, when the signal from first node 701 switches low, first control transistor 722 turns off, and second control transistor 724 turns off when $V_S$ at drain S1 discharges. This prevents the above-mentioned leaky transistor problems because body B1 only floats when both the $V_D$ of drain D1, the $V_S$ of source S1 and the $V_G$ of gate G1 are all zero. Moreover, third control transistor 726 provides a discharge path for body B1 when drain D1 and source S1 switch low, thereby preventing potential discharge through the source- and drain-junctions. However, the introduction of third control transistor 726 may slow the signal propagation speed through pass transistor 710 due to the added capacitance from the connection to body B1 through third control transistor 726 and the gates G2 and G3. Further, the connection of body B1 to gate G1 through first and second control transistors 722 and 724 may disturb a memory cell (not shown) connected to third node 703.

Figure 8:
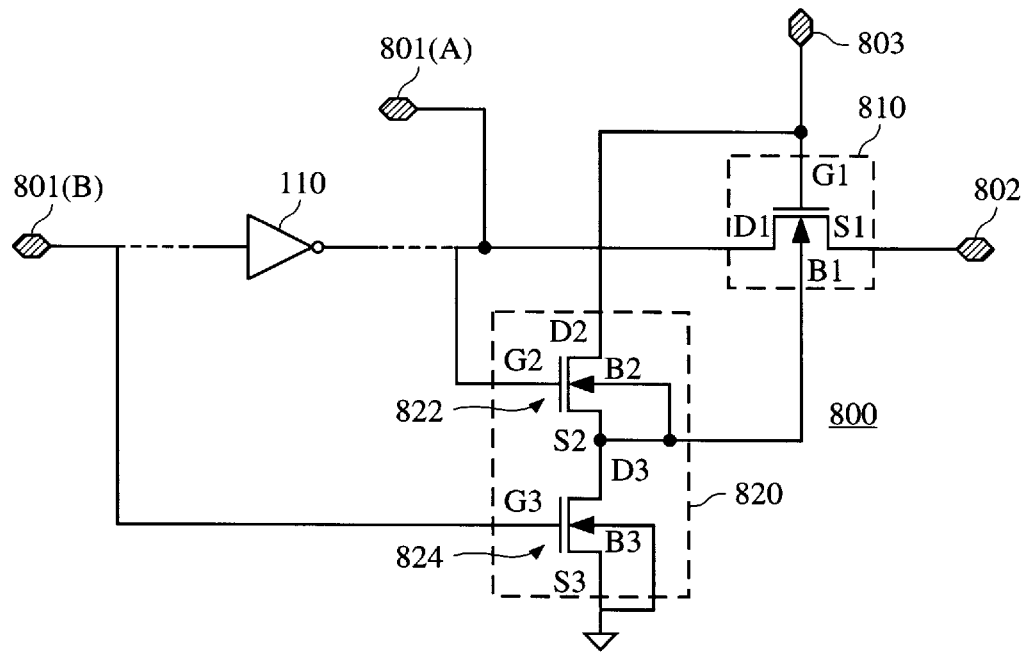
FIG. 8 is a simplified circuit diagram showing an pass gate circuit in accordance with a seventh embodiment of the present invention.

FIG. 8 shows a simplified circuit diagram illustrating a pass gate circuit 800 in accordance with a seventh embodiment of the present invention. Pass gate circuit 800 includes an NMOS pass transistor 810 and a body bias control circuit 820. Pass transistor 810 includes a drain (first terminal) D1 connected to a first node 801(A), a source (second terminal) S1 connected to a second node 802, a gate G1 connected to a third node 803, and a body B1. Bias control circuit 820 includes a first pass (control) transistor 822 and a second pass (control) transistor 824. First control transistor 822 includes a drain (first terminal) D2 connected to gate G1 (third node 803), a source (second terminal) S2 connected to body B1, a gate G2 connected to drain D1 (first node 801(A), and a body B2. Second control transistor 824 includes a drain (first terminal) D3 connected to source S2 of first control transistor 822, a gate G3 connected to a fourth node 801(B), a source (second terminal) S3 and a body B3, both connected to ground. Bodies B1 and B2 are electrically interconnected.

In accordance with the seventh embodiment, fourth node 801(B) supplies a signal to gate G3 of second control transistor 824 which is the inverse of first node 801(A). This inverse signal may be produced by an inverter which forms an element of pass gate circuit 800. Conversely, as shown in FIG. 8, pass gate circuit 800 preferably utilizes an inverter which is provided for other reasons, such as inverter 110 (see FIG. 1A) which, as discussed above, is provided in the signal path through pass transistor 810 in FPGAs produced by Xilinx, Inc.

In operation, pass transistor 810 is turned on by a high signal applied from third node 803 to gate G1. This high signal is also applied to drain D2 of first control transistor 822. Subsequently, when a low signal is supplied from fourth node 801(B), this low signal turns off second control transistor 824, and passes through inverter 110. The inverted (high) signal from inverter 110 is passed through pass transistor 810 to source S1, and also turns on first control transistor 822, thereby transmitting the high voltage on gate G1 to body B1. Conversely, when a high signal is supplied from fourth node 801(B), this high signal turns on second control transistor 824, thereby connecting body B1 to ground through second control transistor 824. At the same time, the inverted (low) signal from inverter 110 turns off first control transistor 822. This prevents the above-mentioned leaky transistor problems and source- and drain-junction discharge problems because body B1 never floats. However, if both first control transistor 822 and second control transistor 824 are conducting simultaneously (e.g. when fourth node 801(B) switches from low to high), the resulting path to ground may cause the memory cell connected to third node 803 to trip.

Figure 9:
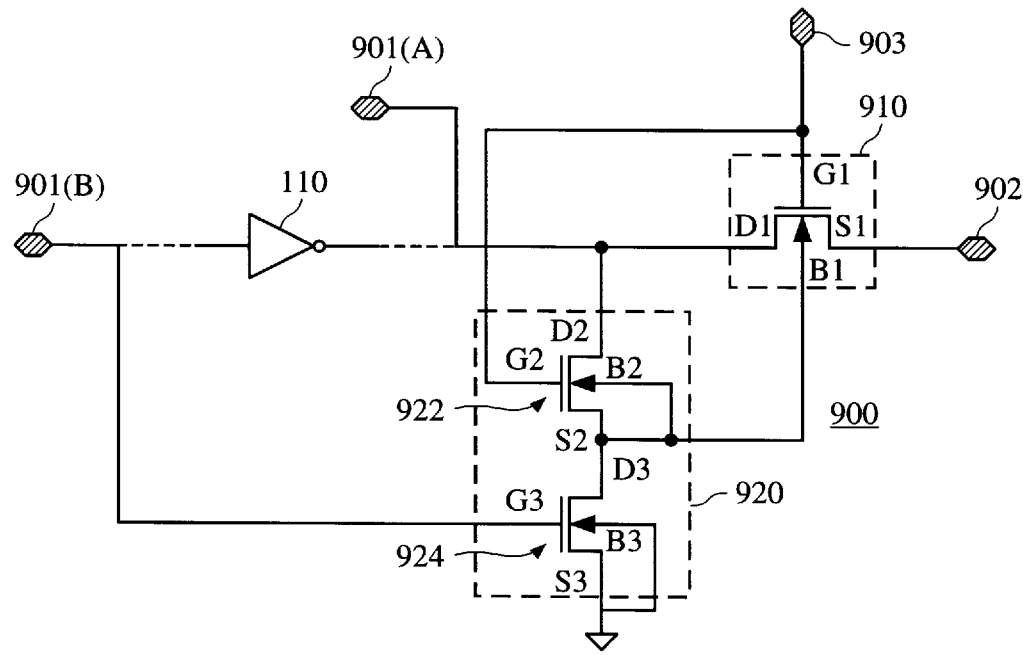
FIG. 9 is a simplified circuit diagram showing an pass gate circuit in accordance with an eighth embodiment of the present invention.

FIG. 9 shows a simplified circuit diagram illustrating a pass gate circuit 900 in accordance with an eighth embodiment of the present invention. Pass gate circuit 900 includes an NMOS pass transistor 910 and a body bias control circuit 920. Bias control circuit 920 is similar to bias control circuit 820 of pass gate circuit 800 (described above), with the exception that gate G2 of first control transistor 922 is connected to gate G1 (instead of drain D1), and drain D2 is connected to drain D1 (instead of gate G1). Second control transistor 924 has the same connections as those of second control transistor 824.

In operation, pass transistor 910 is turned on by a high signal applied from third node 903 to gate G1. This high signal also turns on first control transistor 922, thereby connecting body B1 to drain D1. Subsequently, when a low signal is supplied from fourth node 901(B), the low signal turns off second control transistor 924, and passes through inverter 110. The inverted (high) signal from inverter 110 is passed through pass transistor 910 to source S1, and also biases body B1 through first control transistor 922. Conversely, when a high signal is supplied from fourth node 901(B), this high signal turns on second control transistor 924, thereby connecting body B1 (and drain D1 through first control transistor 922) to ground through second control transistor 924. This prevents the above-mentioned leaky transistor problems because body B1 only floats when the drain voltage $V_D$ at drain D1 is high and the gate voltage $V_G$ is low. Further, because the third node 903 is not connected to ground (as in pass gate circuit 800), the memory-disturb problem is avoided.

Figure 10:
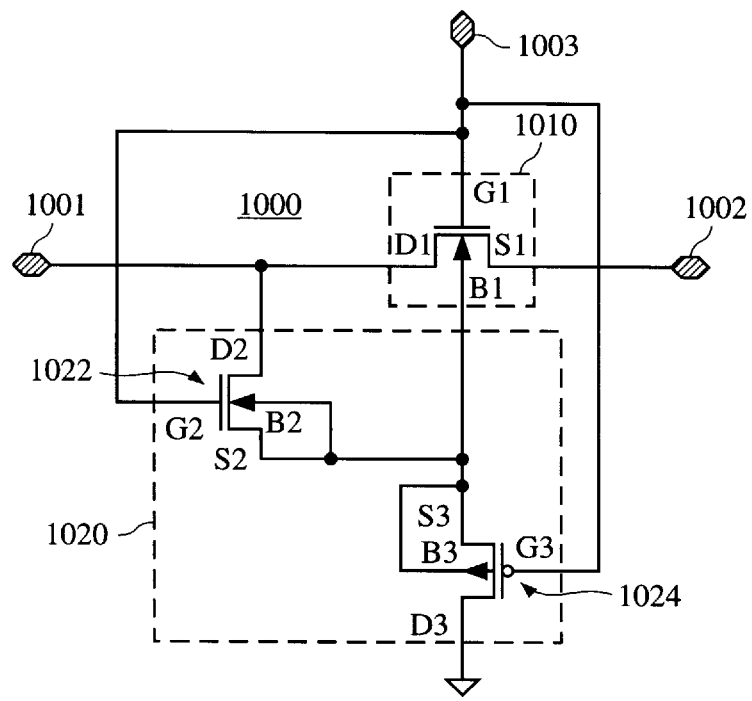
FIG. 10 is a simplified circuit diagram showing an pass gate circuit in accordance with a ninth embodiment of the present invention.

FIG. 10 shows a simplified circuit diagram illustrating a pass gate circuit 1000 in accordance with a ninth embodiment of the present invention. Pass gate circuit 1000 includes a pass transistor 1010 and a body bias control circuit 1020. In accordance with the ninth embodiment, bias control circuit 1020 includes a first pass (control) transistor 1022 and a second (control) transistor 1024. First control transistor 1022 is a NMOS transistor including a drain (first terminal) D2 connected to drain D1 (first node 1001) of pass transistor 1010, a source (second terminal) S2 connected to body B1 of pass transistor 1010, a gate G2 connected to gate G1 (third node 1003), and a body B2. Second control transistor 1024 is a PMOS transistor including a source (first terminal) S3 connected to body B1, a drain (second terminal) D3 connected to ground, a gate G3 connected to gate G1 (third node 1003), and a body B3. Bodies B1, B2 and B3 are electrically interconnected.

In operation, pass transistor 1010 is turned on by a high signal applied from third node 1003 to gate G1. This high signal also turns on first control transistor 1022 and turns off second control transistor 1024. When a high signal is transmitted from first node 1001 through pass transistor 1010, this high signal also biases body B1 through first control transistor 1022. When a low signal is transmitted from first node 1001, body B1 discharges through first control transistor 1022. Conversely, when a low signal is supplied from third node 1003, this low signal turns off pass transistor 1010 and first control transistor 1022, and turns on second control transistor 1024, thereby connecting body B1 to ground through second control transistor 1024. This prevents the above-mentioned leaky transistor problems and source- and drain-junction discharge problems because body B1 never floats. However, second control transistor 1024 only pulls body B1 down to $V_{tp}$. Further, the added capacitance from the connection to body B1 through third control transistor 1022 may slow the signal propagation speed through pass transistor 1010.

Figure 11:
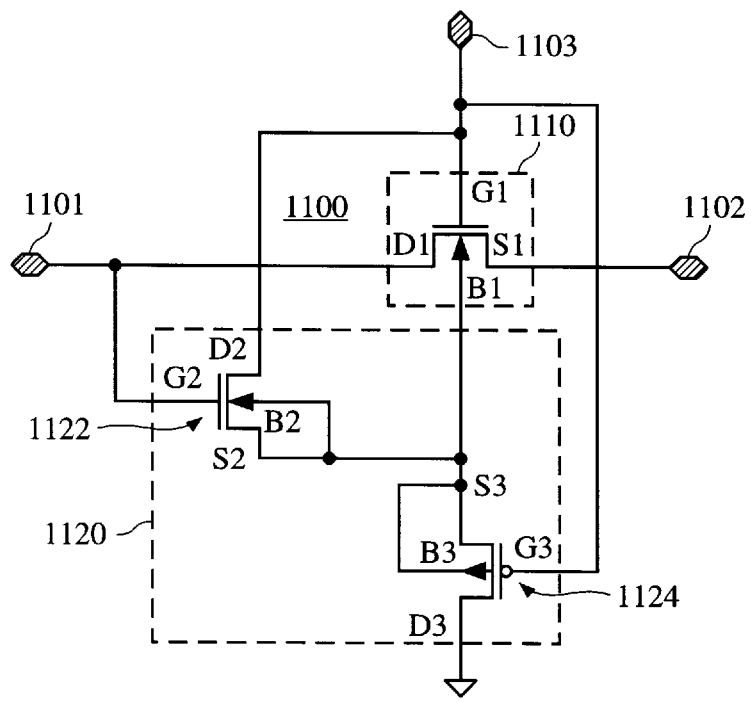
FIG. 11 is a simplified circuit diagram showing an pass gate circuit in accordance with a tenth embodiment of the present invention.

FIG. 11 shows a simplified circuit diagram illustrating a pass gate circuit 1100 in accordance with a tenth embodiment of the present invention. Pass gate circuit 1100 includes a pass transistor 1110 and a body bias control circuit 1120. Bias control circuit 1120 is similar to bias control circuit 1020 of pass gate circuit 1000 (described above), with the exception that gate G2 of first control transistor 1122 is connected to drain D1 (instead of gate G1), and drain D2 is connected to gate G1 (instead of drain D1). Second control transistor 1124 has the same connections as those of second control transistor 1024.

In operation, pass transistor 1110 is turned on by a high signal applied from third node 1103 to gate G1. This high signal is also applied to drain D1 of first control transistor 1122 and turns off second control transistor 1124. When a high signal is transmitted from first node 1101 through pass transistor 1110, this high signal turns on first control transistor 1122 so that body B1 is connected to gate G1 through first control transistor 1122. When a low signal is transmitted from first node 1101, first control transistor 1122 turns off, thereby isolating body B1. Conversely, when a low signal is supplied from third node 1103, this low signal turns off pass transistor 1110 turns on second control transistor 1124, thereby connecting body B1 to ground through second control transistor 1124.

Pass gate circuit 1100 prevents the above-mentioned leaky transistor problems because body B1 only floats when drain D1 is low and gate G1 is high—this does not present a problem because, in this state, pass transistor 1110 is passing a logic zero (low) signal. Further, signal propagation through pass transistor 1110 may be somewhat faster than that of pass gate circuit 1000 because body B1 is never connected to the signal path through pass transistor 1110. However, as discussed above with respect to the pass gate cell 1000, second control transistor 1124 only pulls body B1 down to $V_{tp}$.

Figure 12:
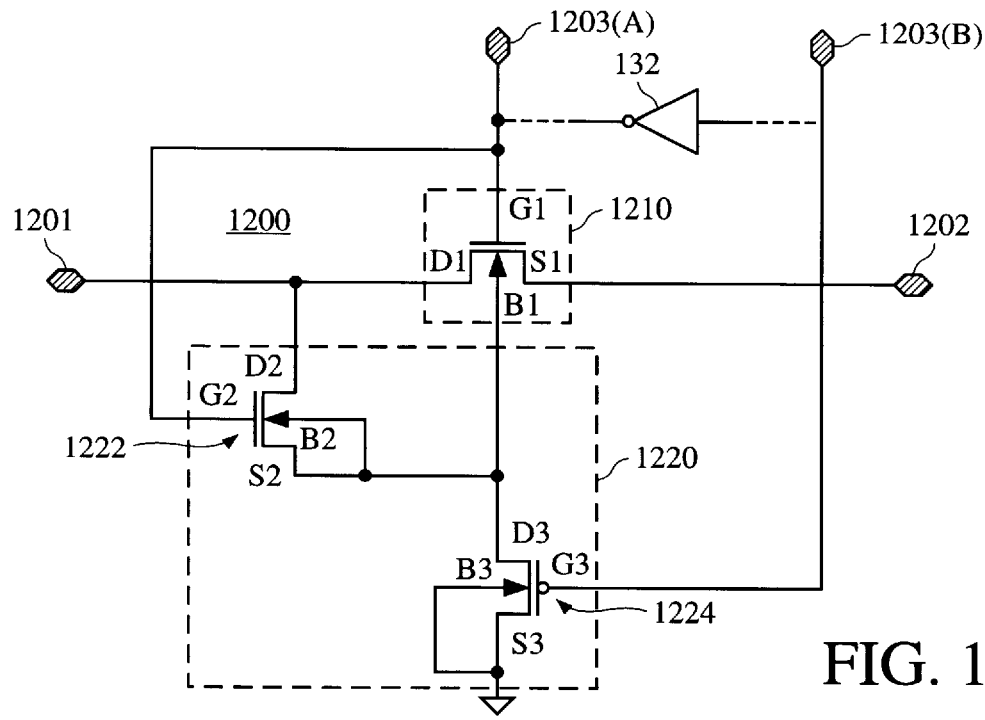
FIG. 12 is a simplified circuit diagram showing an pass gate circuit in accordance with an eleventh embodiment of the present invention.

FIG. 12 shows a simplified circuit diagram illustrating a pass gate circuit 1200 in accordance with a eleventh embodiment of the present invention. Pass gate circuit 1200 includes a pass transistor 1210 and a body bias control circuit 1220. Bias control circuit 1220 includes a first pass (control) transistor 1222 and a second pass (control) transistor 1224. First control transistor 1222 includes a drain (first terminal) D2 connected to drain D1 (first node 1201), a source (second terminal) S2 connected to body B1 of pass transistor 1210, a gate G2 connected to gate G1 (third node 1203(A) of pass transistor 1210, and a body B2. Second control transistor 1224 includes a drain (first terminal) D3 connected to body B1, a source (second terminal) S3 connected to ground, a gate G3 connected to a fourth node 1203(B), and a body B3. Bodies B1 and B2 are electrically interconnected, and body B3 is grounded.

In accordance with the eleventh embodiment, fourth node 1203(B) supplies a signal to gate G3 of second control transistor 1224 which is the inverse of third node 1203(A). This inverse signal may be produced by an inverter which forms an element of pass gate circuit 1200. Conversely, as shown in FIG. 12, pass gate circuit 1200 preferably utilizes one of the inverters (such as inverter 132 shown in FIG. 1A) making up SRAM cell 130 which, as discussed above, is provided as a programmable element for controlling the conductive state of pass transistors in FPGAs produced by Xilinx, Inc.

In operation, pass transistor 1210 is turned on by a high signal applied from third node 1203(A) to gate G1. This high signal also turns on first control transistor 1222. Alternatively, an inverse (low) signal is applied from fourth node 1203(B) to gate G3, thereby turning off second control transistor 1224. When a high signal is transmitted from first node 1201 through pass transistor 1210, this high signal also biases body B1 through first control transistor 1222. When a low signal is transmitted from first node 1201, body B1 discharges through first control transistor 1222. Conversely, a low signal transmitted from third node 1203(A) turns off pass transistor 1210 and first control transistor 1222, and the inverse (high) signal from fourth node 1203(B) turns on second control transistor 1224, thereby connecting body B1 to ground through second control transistor 1224. This prevents the above-mentioned leaky transistor problems and source- and drain-junction discharge problems because body B1 never floats. However, the added capacitance from the connection to body B1 through second control transistor 1222 may slow the signal propagation speed through pass transistor 1210.

Figure 13:
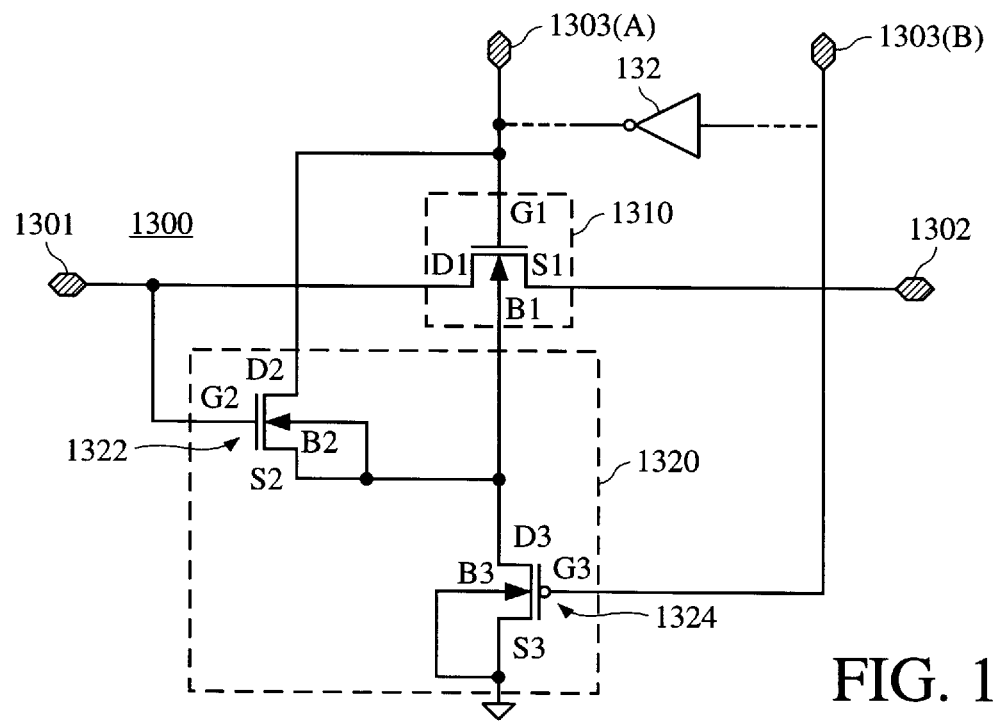
FIG. 13 is a simplified circuit diagram showing an pass gate circuit in accordance with a twelfth embodiment of the present invention.

FIG. 13 shows a simplified circuit diagram illustrating a pass gate circuit 1300 in accordance with a twelfth embodiment of the present invention. Pass gate circuit 1300 includes a pass transistor 1310 and a body bias control circuit 1320. Bias control circuit 1320 is similar to bias control circuit 1220 of pass gate circuit 1200 (described above), with the exception that gate G2 of first control transistor 1322 is connected to drain D1 (instead of gate G1), and drain D2 is connected to gate G1 (instead of drain D1). Second control transistor 1324 has the same connections as those of second control transistor 1224.

In operation, pass transistor 1310 is turned on by a high signal applied from third node 1303(A) to gate G1. This high signal is also applied to drain D2 of first control transistor 1322. Alternatively, an inverse (low) signal is applied from fourth node 1303 (B) to gate G3, thereby turning off second control transistor 1324. When a high signal is transmitted from first node 1301 through pass transistor 1310, this high signal turns on first control transistor 1322 so that body B1 is connected to gate G1 through first control transistor 1322. When a low signal is transmitted from first node 1301, first control transistor 1322 turns off, thereby isolating body B1. Conversely, a low signal transmitted from third node 1303 (A) turns off pass transistor 1310. Alternatively, the inverse (high) signal generated by fourth node 1303(B) turns on second control transistor 1324, thereby connecting body B1 to ground through second control transistor 1324.

The twelfth embodiment prevents the above-mentioned leaky transistor problems because body B1 only floats when drain D1 is low and gate G1 is high—this does not present a problem because, in this state, pass transistor 1310 is passing a logic zero (low) signal. Further, signal propagation through pass transistor 1310 is somewhat faster than that of pass gate circuit 1200 because body B1 is never connected to the signal path through pass transistor 1310.

Although the present invention has been described in considerable detail with reference to certain preferred embodiments thereof, other embodiments are possible. For example, the present invention is described above with reference to numerous embodiments using mostly NMOS transistors (the embodiments shown in FIGS. 10 and 11 also incorporate a PMOS transistor). Although NMOS currently provides speed advantages over PMOS, the pass gate circuits described may be produced using PMOS transistors. Further, alternative circuits may be used in place of the specific bias control circuits described above with respect to the various embodiments of the present invention. In view of this and other possible alternative embodiments, the spirit and scope of the appended claims should not be limited to the description of the preferred embodiments contained herein.

We claim:

1. A pass gate circuit comprising:

a pass transistor including a gate, a first terminal and a body; and a body bias control circuit connected between the first terminal, the gate and the body;

wherein the body bias control circuit is controlled by one of the first terminal and the gate to selectively connect the body to one of the first terminal and the gate when one of the first terminal and the gate are at predetermined voltage levels.

2. The pass gate circuit according to claim 1, wherein the body bias control circuit comprises:

a first control transistor having a first terminal and a gate connected to the gate of the pass transistor, the first control transistor also having a second terminal; and a second control transistor having a first terminal connected to the second terminal of the first control transistor, a gate connected to the first terminal of the pass transistor, and a second terminal connected to the body of the pass transistor.

3. The pass gate circuit according to claim 1, wherein the body bias control circuit comprises:

a control transistor having a first terminal connected to the gate of the pass transistor, a second terminal connected to the body of the pass transistor, and a gate connected to the first terminal of the pass transistor.

4. The pass gate circuit according to claim 1, wherein the body bias control circuit comprises:

a control transistor having a first terminal connected to the first terminal of the pass transistor, a second terminal connected to the body of the pass transistor, and a gate connected to the gate of the pass transistor.

5. The pass gate circuit according to claim 1, wherein the body bias control circuit comprises:

a first control transistor having a first terminal connected to the first terminal of the pass transistor, a second terminal connected to the body of the pass transistor, and a gate connected to the gate of the pass transistor; and a second control transistor having a first terminal connected to the gate of the pass transistor, a gate connected to the first terminal of the pass transistor, and a second terminal connected to the body of the pass transistor.

6. The pass gate circuit according to claim 1, wherein the body bias control circuit comprises:

a first control transistor having a first terminal connected to the gate of the pass transistor, a second terminal connected to the body of the pass transistor, and a gate connected to the first terminal of the pass transistor; and a second control transistor having a first terminal connected to the gate of the pass transistor, a gate connected to a second terminal of the pass transistor, and a second terminal connected to the body of the pass transistor.

7. The pass gate circuit according to claim 1, wherein the body bias control circuit comprises:

a first control transistor having a first terminal connected to the gate of the pass transistor, a second terminal connected to the body of the pass transistor, and a gate connected to the first terminal of the pass transistor;

a second control transistor having a first terminal connected to the gate of the pass transistor, a gate connected to a second terminal of the pass transistor, and a second terminal connected to the body of the pass transistor; and a third control transistor having a first terminal connected to the first terminal of the pass transistor, a second terminal connected to the body of the pass transistor, and a gate connected to the gate of the pass transistor.

8. The pass gate circuit according to claim 1, wherein the body bias control circuit comprises:

a first control transistor having a first terminal connected to the gate of the pass transistor, a gate connected to the first terminal of the pass transistor, and a second terminal connected the body of the pass transistor; and a second control transistor having a first terminal connected to the second terminal of the first control transistor and the body of the pass transistor, a gate, and a second terminal connected to ground;

wherein the gate of the second control transistor is controlled by a first signal, and the first terminal of the pass transistor receives a second signal, and wherein the first signal is a logical inverse of the second signal.

9. The pass gate circuit according to claim 8, further comprising an inverter, wherein the gate of the second control transistor is connected to an input terminal of the inverter, and the first terminal of the pass transistor is connected to an output terminal of the inverter.

10. The pass gate circuit according to claim 1, wherein the body bias control circuit comprises:

a first control transistor having a first terminal connected to the first terminal of the pass transistor, a gate connected to the gate of the pass transistor, and a second terminal connected the body of the pass transistor; and a second control transistor having a first terminal connected to the second terminal of the first control transistor and to the body of the pass transistor, a gate, and a second terminal connected to ground;

wherein the gate of the second control transistor is controlled by a first signal, and the first terminal of the pass transistor receives a second signal, and wherein the first signal is a logical inverse of the second signal.

11. The pass gate circuit according to claim 10, further comprising an inverter, wherein the gate of the second control transistor is connected to an input terminal of the inverter, and the first terminal of the pass transistor is connected to an output terminal of the inverter.

12. The pass gate circuit according to claim 1, wherein the body bias control circuit comprises:

a first control transistor having a first terminal connected to the first terminal of the pass transistor, a gate connected to the gate of the pass transistor, and a second terminal connected to the body of the pass transistor; and a second control transistor having a first terminal connected to the body of the pass transistor, a second terminal connected to ground, and a gate connected to the gate of the pass transistor.

13. The pass gate circuit according to claim 12, wherein the first control transistor is an NMOS transistor, and the second control transistor is a PMOS transistor.

14. The pass gate circuit according to claim 1, wherein the body bias control circuit comprises:

a first control transistor having a first terminal connected to the gate of the pass transistor, a gate connected to the first terminal of the pass transistor, and a second terminal connected to the body of the pass transistor; and a second control transistor having a first terminal connected to the body of the pass transistor, a second terminal connected to ground, and a gate connected to the gate of the pass transistor.

15. The pass gate circuit according to claim 14, wherein the first control transistor is an NMOS transistor, and the second control transistor is a PMOS transistor.

16. The pass gate circuit according to claim 1, wherein the body bias control circuit comprises:

a first control transistor having a first terminal connected to the first terminal of the pass transistor, a gate connected to the gate of the pass transistor, and a second terminal connected to the body of the pass transistor; and a second control transistor having a first terminal connected to ground, a gate, and a second terminal connected to the body of the pass transistor;

wherein the gate of the second control transistor is controlled by a first signal, and the gate of the pass transistor receives a second signal, and wherein the first signal is a logical inverse of the second signal.

17. The pass gate circuit according to claim 16, further comprising an inverter, wherein the gate of the second control transistor is connected to an input terminal of the inverter, and the gate of the pass transistor is connected to an output terminal of the inverter.

18. The pass gate circuit according to claim 17, wherein the inverter is incorporated into an SRAM cell.

19. The pass gate circuit according to claim 1, wherein the body bias control circuit comprises:

a first control transistor having a first terminal connected to the gate of the pass transistor, a gate connected to the first terminal of the pass transistor, and a second terminal connected to the body of the pass transistor; and a second control transistor having a first terminal connected to ground, a gate, and a second terminal connected to the body of the pass transistor;

wherein the gate of the second control transistor is controlled by a first signal, and the gate of the pass transistor receives a second signal, and wherein the first signal is a logical inverse of the second signal.

20. The pass gate circuit according to claim 19, further comprising an inverter, wherein the gate of the second control transistor is connected to an input terminal of the inverter, and the gate of the pass transistor is connected to an output terminal of the inverter.

21. The pass gate circuit according to claim 20, wherein the inverter is incorporated into an SRAM cell.

22. The pass gate circuit according to claim 1, wherein the body bias control circuit comprises a control transistor which is formed in a common well region with the pass transistor such that a body of the control transistor is electrically connected to the body of the pass transistor.

* * * * *